United States Patent
Schram et al.

(10) Patent No.: US 9,245,759 B2
(45) Date of Patent: Jan. 26, 2016

(54) METHOD FOR MANUFACTURING A DUAL WORK FUNCTION SEMICONDUCTOR DEVICE

(71) Applicant: IMEC, Leuven (BE)

(72) Inventors: Tom Schram, Rixensart (BE); Christian Caillat, Versonnex (FR); Alessio Spessot, Gradisxa D'isonzo (IT); Pierre Fazan, Loney (CH); Lars-Ake Ragnarsson, Leuven (BE); Romain Ritzenthaler, Kessel-lo (BE)

(73) Assignee: IMEC, Leuven (BE)

( * ) Notice: Subject to any disclaimer, the term of this patent is extended or adjusted under 35 U.S.C. 154(b) by 40 days.

(21) Appl. No.: 14/047,849

(22) Filed: Oct. 7, 2013

(65) Prior Publication Data

US 2014/0106556 A1 Apr. 17, 2014

(30) Foreign Application Priority Data

Oct. 8, 2012 (EP) ..................... 12187571

(51) Int. Cl.
*H01L 21/8238* (2006.01)
*H01L 21/28* (2006.01)
(Continued)

(52) U.S. Cl.
CPC .... *H01L 21/28008* (2013.01); *H01L 21/28176* (2013.01); *H01L 21/28185* (2013.01);
(Continued)

(58) Field of Classification Search
CPC ............... H01L 21/823842; H01L 29/4966; H01L 21/823857; H01L 27/092; H01L 21/28176; H01L 21/28185; H01L 21/8238; H01L 29/66477
USPC .......... 438/199, 275, 287, 197, 154, 216, 660
See application file for complete search history.

(56) References Cited

U.S. PATENT DOCUMENTS

| | | | |
|---|---|---|---|
| 2003/0180994 A1* | 9/2003 | Polishchuk et al. | 438/199 |
| 2007/0054446 A1* | 3/2007 | Chambers et al. | 438/197 |
| 2009/0286387 A1* | 11/2009 | Gilmer et al. | 438/592 |
| 2009/0309165 A1 | 12/2009 | Ogawa et al. | |
| 2010/0001348 A1 | 1/2010 | Mitsuhashi et al. | |

(Continued)

FOREIGN PATENT DOCUMENTS

| | | |
|---|---|---|
| JP | 2010-177265 | 8/2010 |
| JP | 2010-272596 | 12/2010 |
| JP | 2011-029296 | 2/2011 |

OTHER PUBLICATIONS

European Search Report dated Feb. 21, 2013 for European Application 12187571.0.

*Primary Examiner* — Bac Au
(74) *Attorney, Agent, or Firm* — Knobbe, Martens, Olson & Bear LLP

(57) ABSTRACT

A method of manufacturing a dual work function semiconductor device is disclosed. In one aspect, the method includes providing a substrate having first and second areas for forming first and second transistor types. The method additionally includes forming a dielectric layer on the substrate, which extends to cover at least parts of the first and second areas. The method additionally includes forming a first metal layer/stack on the dielectric layer in the first area, where the first metal layer/stack comprises a first work function-shifting element. The method additionally includes forming a second metal layer/stack on the first metal layer in the first area and on the dielectric layer in the second area, where the second metal layer/stack comprises a second work function-shifting element. The method additionally includes annealing to diffuse the first work function-shifting element and the second work function-shifting element into the dielectric layer, and subsequently removing the first metal layer/stack and the second metal layer/stack. The method further includes forming a third metal layer/stack in the first and second predetermined areas.

20 Claims, 14 Drawing Sheets

(51) Int. Cl.
*H01L 29/49* (2006.01)
*H01L 29/66* (2006.01)
*H01L 27/092* (2006.01)

(52) U.S. Cl.
CPC .... *H01L21/8238* (2013.01); *H01L 21/823842* (2013.01); *H01L 21/823857* (2013.01); *H01L 29/4966* (2013.01); *H01L 29/66477* (2013.01); *H01L 27/092* (2013.01)

(56) References Cited

U.S. PATENT DOCUMENTS

| | | |
|---|---|---|
| 2010/0038729 A1 | 2/2010 | Eimori et al. |
| 2010/0197128 A1 | 8/2010 | Schaeffer et al. |
| 2010/0279496 A1 | 11/2010 | Kadoshima et al. |
| 2010/0327365 A1 | 12/2010 | Iwamoto |
| 2011/0127616 A1* | 6/2011 | Hoentschel et al. .......... 257/392 |
| 2013/0087859 A1* | 4/2013 | Liang et al. .................. 257/369 |

* cited by examiner

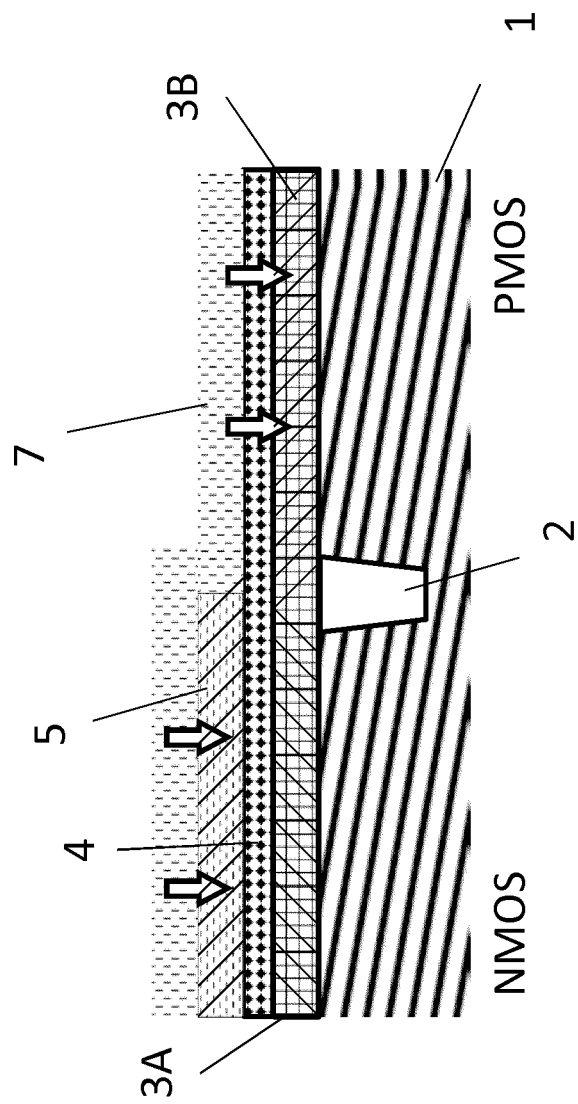

METHOD FOR MANUFACTURING A DUAL WORK FUNCTION SEMICONDUCTOR DEVICE

CROSS-REFERENCE TO RELATED APPLICATIONS

This application claims foreign priority to European patent application EP 12187571.0 filed on Oct. 8, 2012, the contents of which is incorporated by reference herein in its entirety.

BACKGROUND OF THE INVENTION

1. Field of the Invention

The disclosed technology relates generally to methods of manufacturing a semiconductor device, and more specifically to methods of manufacturing a dual work function semiconductor device.

2. Description of the Related Technology

CMOS technology utilizes NMOS transistors and PMOS transistors having different gate metals with different effective work functions. Generally, a CMOS process integration scheme employing high-k/metal gate technology can be "gate-first" or "gate-last," depending on whether the gate electrode of a transistor is formed before or after the formation of transistor junctions. Different integration schemes face different fabrication challenges. In gate-first CMOS integration schemes employing the high K/metal gate technology, different effective work functions for NMOS and PMOS transistors are sometimes obtained using different capping layers or different metal stacks for the NMOS and PMOS transistors. In some technologies, the capping layers can comprise rare earth elements. In other technologies, the capping layers can comprise other elements such as Mg for the NMOS transistor and Al or $Al_2O_3$ for the PMOS transistor.

Patterning the cap layers of the transistors in gate-first CMOS integration schemes employing the high-k/metal gate technology introduces certain process integration challenges. For example, when different metal stacks are used for NMOS and PMOS transistors, the gate etch has to be performed simultaneously on different stack heights, or even on two totally different stacks. The difference in stack materials and/or stack heights can cause various problems. One such problem can arise during etching of the gates. For instance, the difference in stack materials and/or the stack heights can result in a first type of gate structure/material (e.g., NMOS or PMOS) to be completely etched prior to a second type of gate structure/material (e.g., PMOS or NMOS). As a consequence, upon completion of etching of the second type of gate structure/material, certain Si and STI regions originally covered by the first type of gate structure may be over-etched, resulting in recesses in the Si and STI regions. Another such problem that can also arise during etching due to the difference in gate stack/materials and/or the gate stack heights is the formation of a "foot" or a notch on one or both types of gate stacks. Therefore, there is a need for CMOS processes for integrating NMOS and PMOS transistors on the same substrate while minimizing the effects of these integration challenges.

SUMMARY OF CERTAIN INVENTIVE ASPECTS

It is an aim of the present disclosure to provide a method for manufacturing a dual work function semiconductor device comprising nMOS and pMOS transistors.

This aim is achieved according to the disclosure with a method showing the technical characteristics of the first independent claim.

It is another aim of the present disclosure to provide an associated device.

This aim is achieved according to the disclosure with a device comprising the technical features of the second independent claim.

According to a first aspect of the present disclosure, a method for manufacturing a dual work function semiconductor device, comprising e.g. nMOS and pMOS transistors, is disclosed, the method comprising:

providing a substrate comprising a first predetermined area for producing a transistor of a first conduction type and a second predetermined area for producing a transistor of a second conduction type, the first conduction type being different from the second conduction type;

providing a dielectric layer on the substrate, said dielectric layer extending over both said first area and said second area;

providing a first metal layer or first metal layer stack comprising a first work function-shifting element on said dielectric layer in said first predetermined area, for instance in only said first predetermined area, for instance in said first predetermined area and not in said second predetermined area;

providing a second metal layer or second metal layer stack comprising a second work function-shifting element on said first metal layer and said dielectric layer, in said first predetermined area and said second predetermined area respectively;

performing an anneal step adapted for driving diffusion of the first work function-shifting elements and the second work function-shifting elements into the dielectric layer;

removing said first metal layer or first metal layer stack and said second metal layer or second metal layer stack;

providing a third metal layer or third metal layer stack in said first predetermined area and said second predetermined area.

The method provides the advantage that a single metal gate is provided for NMOS and PMOS and that this metal gate is fixed during the further process flow. This simplifies the definition of the gate structures as it allows a typically dry, gate etch process, which eventually defines the gate structures, with relatively low complexity.

Another advantage is for instance that a single final gate height is achieved for NMOS and PMOS, again easing the gate definition, e.g. gate etch, process.

The substrate can be for instance a silicon substrate or a SiGe substrate, preferably with a Ge concentration below 50%, or a Silicon-on-insulator (SOI) substrate. Further examples of substrates are given in the detailed description.

The method can advantageously be used for manufacturing transistor devices, preferably of the planar type. Application in the field of vertical type transistor devices (such as for example finfet devices) is though not excluded.

A transistor of a first conduction type can be a PMOS transistor or a NMOS transistor. The transistor of the second conduction type can then respectively be a NMOS or PMOS transistor. The first conduction type is thus different than (and more specifically opposite to) the second conduction type.

In a MOSFET device, a threshold voltage (Vt) applied on the gate of the device renders the channel conductive. Complementary MOS (CMOS) processes fabricate both n-channel and p-channel (respectively NMOS and PMOS) transistors. The Vt of a MOSFET device depends on many factors. For example, the threshold voltage Vt can be influenced by what is called the effective work function difference ($\Delta WF_{eff}$). To establish threshold voltage (Vt) values, the effective work function differences of the respective PMOS and NMOS gate materials (gate stacks) and their corresponding channel regions can be independently established through channel processing and gate processing. In other words, both the gate dielectric (including, for example, a host dielectric and possible different capping layers) and the gate electrode (including, for example, at least one metal layer) can determine the effective work function of the gate stack (device) ($WF_{eff}$). Moreover, the gate processing itself (i.e. the sequence of the different processes and/or the thermal treatments applied) may have an influence on the effective work function of the gate stack (device) ($WF_{eff}$).

The effective work function of a gate stack (device) ($WF_{eff}$) is a parameter that can be tuned (adjusted/modified/shifted) by the choice of the gate dielectric materials, gate electrode materials and by the gate processing performed. On the contrary, the work function (WF) of the gate electrode (often referred to as metal gate electrode or metal layer or metal control electrode) is considered to be an intrinsic property of the material. In general, the work function of a certain material (i.e. a metal layer) is a measure of the energy, in electron volts (eV), above which an electron receiving such energy may be ejected from the material to a surrounding vacuum, if the electron were initially at the Fermi level. The work function of the gate electrode may also be referred to as as-deposited work function or the intrinsic work function of the material.

According to some embodiments, the work function (work function-shifting elements) is the effective work function (effective work function-shifting elements). The effective work function for silicon substrates can be the work function extracted from a Metal Insulator Silicon capacitor device in accumulation with the same gate electrode, high-k gate dielectric and doped Si substrate as used in the transistor device. To calculate the effective work function for silicon substrates, the flat band voltage of the capacitor device is preferably extracted using a C-V based method as described in "Characterization of Ultra-Thin Oxides Using Electrical C-V and I-V Measurements.", J. R. Hauser and K. Ahmed, International conference on Characterization and Metrology for ULSI Technology, 1998, pp. 235-239, which is hereby integrated by reference. Without being bound to any theory, the effective work function can be calculated with the following equation, wherein zero charge in the dielectric is assumed:

$$\text{effective work function} = \phi_{eff\ stack} = V_{FB,\ measured} + \phi_{doped\ Si}$$

wherein $\phi_{doped\ Si}$ is the Fermi level of the doped Si substrate.

In some embodiments, the N-type shifting element can be an additive element that allows shifting the effective work function of the gate stack towards the silicon (or semiconductor substrate) conduction band edge by diffusing into or through the high-k gate dielectric stack.

In some embodiments, the P-type shifting element can be an additive element that allows shifting the effective work function of the gate stack towards the silicon (or semiconductor substrate) valence band edge by diffusing it into or through the high-k gate dielectric stack.

According to some embodiments, the method comprises an independent anneal step, for driving diffusion of the first work function-shifting elements into the dielectric layer, before depositing the second metal layer or second metal layer stack comprising the second work function-shifting element.

This provides the advantages that when the final anneal step adapted for driving diffusion of the shifting elements into the dielectric layer would be insufficient for driving in the first work function-shifting elements into the dielectric layer, the latter process can independently be controlled or optimized.

According to some embodiments, the anneal step is such that it does not provide diffusion of the second work function-shifting element into the dielectric layer in the first predetermined area.

This provides the advantage that a possible diffusion of the second work function-shifting element through the first metal layer or first metal layer stack in the first predetermined area into the dielectric layer in the first predetermined area can be controlled or avoided.

According to some embodiments, the method further comprises providing an etch stop layer, preferably a wet etch stop layer, on the dielectric layer before depositing the first and the second metal layer or the first or the second metal layer stack, the etch stop layer being substantially etch-resistant to an etchant adapted for etching the first metal layer or first metal layer stack and/or the second metal layer or second metal layer stack, and the etch stop layer being adapted for allowing the diffusion of the first work function-shifting elements and the second work function-shifting elements through it. As used herein, a first material can be substantially etch-resistant compared to a second material to an etchant when a first etch rate of the first material is slower than a second etch rate of the second material by a factor exceeding about 5×. According to some embodiments, the etch stop layer can completely cover the dielectric layer. The etch stop layer can completely cover the first predetermined area and the second predetermined area. The etch stop layer can completely conceal the dielectric layer.

Employing the etch stop layer provides the advantage that the (typically high-k, i.e. having a high dielectric constant) dielectric can be protected from exposure to wet and plasma processing during further processing of the device, which can otherwise be affected by such processing and as a consequence affect the final electrical properties of the final gate stack.

According to some embodiments, the etch stop layer comprises any of or any combination of TaN, Ta or $Ta_2O_3$ or TaO (Ta sub oxide formed by air oxidation of Ta), and TiN.

According to some embodiments, the etch stop layer is embodied as a bi-layer comprising a TaN layer and a TaO or $Ta_2O_3$ layer, or as a bi-layer comprising a TiN layer and a TaO or $Ta_2O_3$ layer.

According to some embodiments, the etch stop layer has the same constitution in the first predetermined area and the second predetermined area.

According to some embodiments, the first metal layer or first metal layer stack, or the second metal layer or second metal layer stack, comprises TiN/Mg/TiN, Mg/TiN, La, $La_2O_3$, or TiN/La/TiN.

According to some embodiments, the second metal layer or second metal layer stack or the first metal layer or first metal layer stack comprises aluminum, aluminum oxide and Al-doped silicon oxide.

According to some embodiments, the first metal layer or first metal layer stack, or the second metal or second metal layer stack, comprises aluminum oxide covered with a layer of TiN or covered with a trilayer comprising TiN/Al/TiN.

It will be appreciated that the order of providing the respective metal layers or metal layer stacks for introducing shifting elements of a first type and a second type in respective areas of the dielectric layer can be switched. For instance, a metal layer or metal layer stack comprising TiN/Mg/TiN, or Mg/TiN, La, La$_2$O$_3$, or TiN/La/TiN can be provided first. This layer can be patterned. Thereafter the second metal layer or layer stack comprising aluminum can be provided. Alternatively, the first metal layer of metal layer stack can be the layer comprising Al. This layer can be patterned. Next, the second metal layer or second metal layer stack comprising TiN/Mg/TiN, or Mg/TiN, La, La$_2$O$_3$, or TiN/La/TiN can be provided.

The eventual positioning of the respective layers with respect to the dielectric layer will determined the conduction type of the respective areas of the dielectric layer.

According to some embodiments, the etch stop layer has a thickness between 0.5 nm and 20 nm, or between 1 nm and 10 nm, or between 2 nm and 10 nm. The etch stop layer can be of constant thickness. The etch stop layer can have a flat upper surface.

According to some embodiments, the substrate comprises an isolation area electrically isolating the first predetermined area from the second predetermined area. The method can further comprise removing a portion of the dielectric layer, and if present of the etch stop layer, and of the third metal layer or third metal layer stack at a location above the isolation region.

The isolation area can for instance be or comprise an area comprising a silicon oxide. It can for instance constitute an area known by the skilled person in the art as a Shallow Trench Isolation (STI).

According to some embodiments, the dielectric layer comprises a high-k dielectric (i.e. with a relative dielectric constant substantially larger than the reference values of SiO$_2$, being 3.9, preferably larger by a factor of 2 to 10). The high-k dielectric typically comprises hafnium oxide (e.g., HfO$_2$), hafnium silicate (e.g., HfSiO$_4$), hafnium silicon nitride (e.g., HfSiN$_x$), zirconium oxide (e.g., ZrO$_2$), or a doped hafnium oxide. The dielectric layer can comprise a single dielectric material or a plurality of dielectric materials, for instance selected from the group consisting of HfO$_2$, HfSiO$_4$, HfSiN$_x$, ZrO$_2$, or a doped hafnium oxide. The dielectric layer can be homogeneous. This means that the dielectric layer can be of the same constitution in the first predetermined area and in the second predetermined area. According to some embodiments, dielectric layer can completely cover a main surface, e.g. the front surface, of the underlying substrate.

According to some embodiments, the dielectric layer has a thickness between 0.5 nm and 5 nm, or between 1 nm and 3 nm. The dielectric layer can be of constant thickness. The dielectric layer can have a flat upper surface.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

Figure 1A:
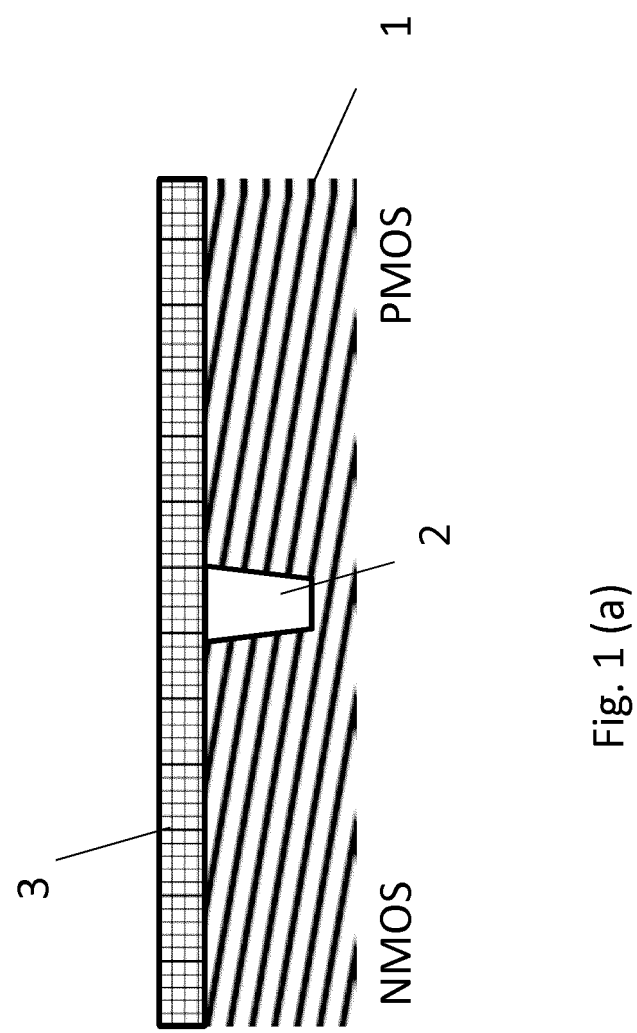
FIGS. 1(a) to (k) illustrate a process flow according to a first embodiment of the present disclosure.
Figure 1B:
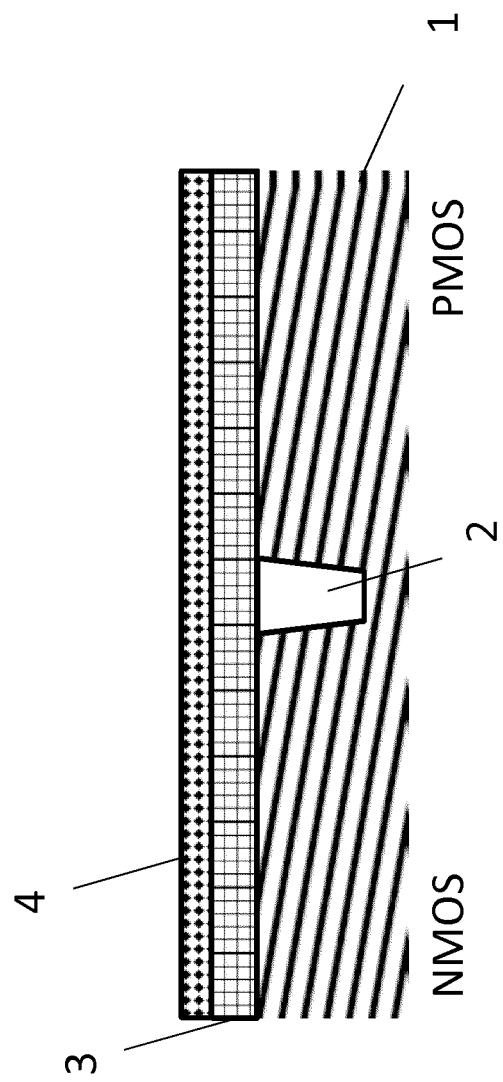
Figure 1C:
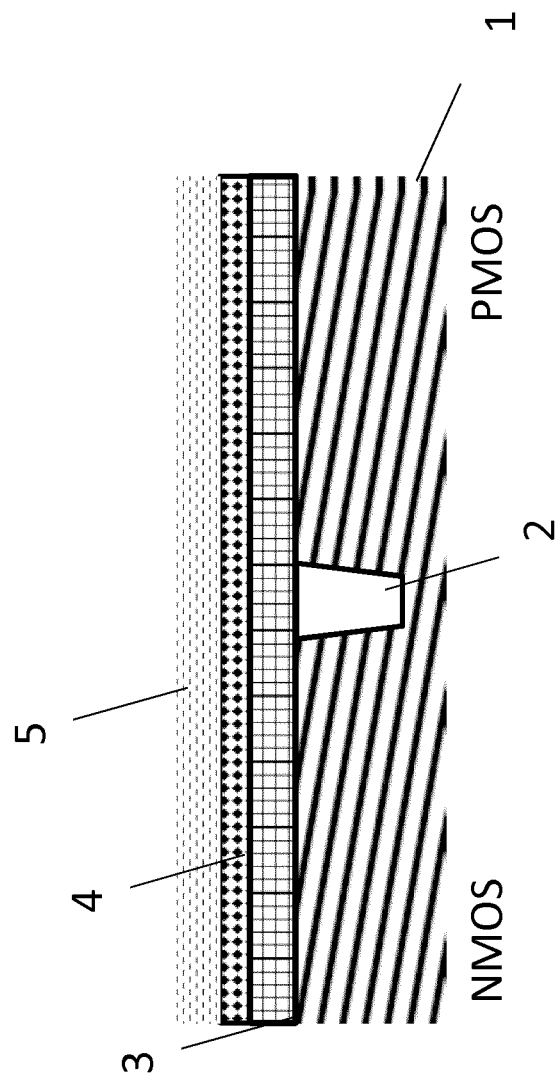

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

In the following, the present invention will be described with reference to a silicon (Si) substrate but it should be understood that the invention applies equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a SiO$_2$ or a Si$_3$N$_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

In FIGS. 1(a) to (k) a process flow according to an example embodiment of the present invention is depicted.

In FIG. 1(a), a substrate 1 is provided according to an embodiment. Active regions for PMOS and NMOS are formed by forming P-wells and N-wells (not depicted). The PMOS and NMOS active regions are electrically isolated from each other by an isolation region 2, which can be, for example, a Shallow Trench Isolation (STI) structures. An interfacial layer (101, not depicted) is formed, which typically comprises a silicon oxide. It can be a grown or deposited SiO$_2$, and can have a thickness in between 0.1 to 2 nm depending on the targeted application.

A high-k dielectric 3 is formed on a main surface (e.g. front surface) of the substrate. The high-k dielectric can comprise a single or multiple layers of materials. In some embodiments, the high-k dielectric 3 comprises an interfacial silicon oxide and/or a high-k dielectric, where the latter can comprise Hf. The high-k dielectric can, for instance, be or comprise a hafnium oxide, a hafnium silicate, or other doped hafnium-based oxides. The thickness of the high-k dielectric can depend on the application, and can for instance be between 1 and 3 nm, although other thicknesses are not excluded.

Figure 1:
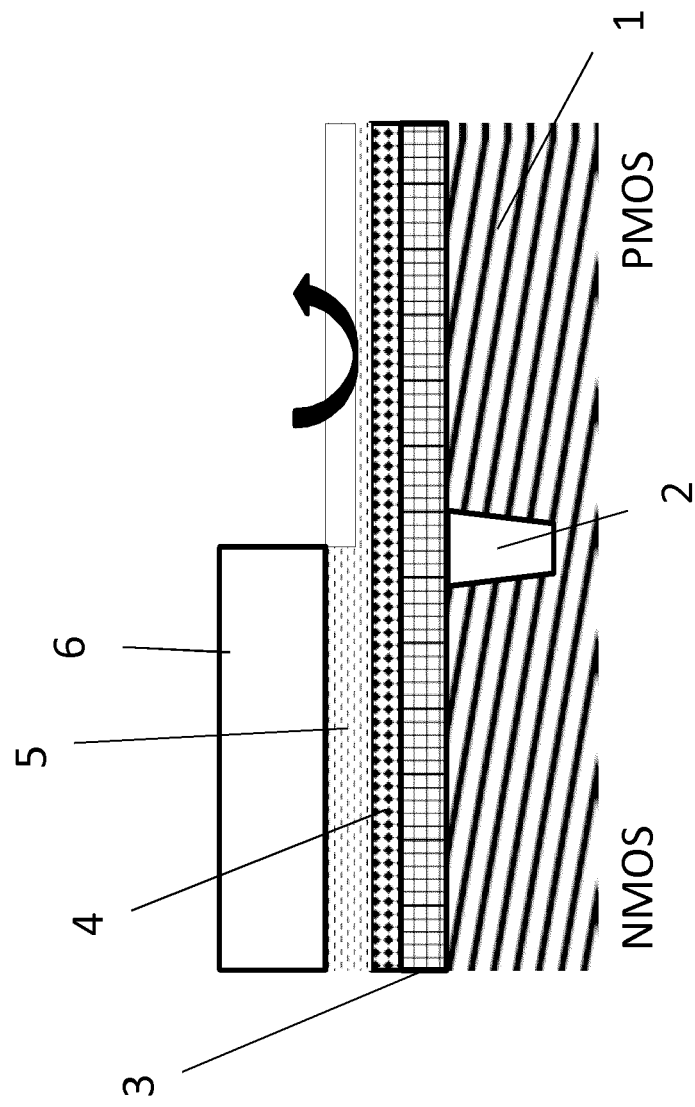
Figure 1:
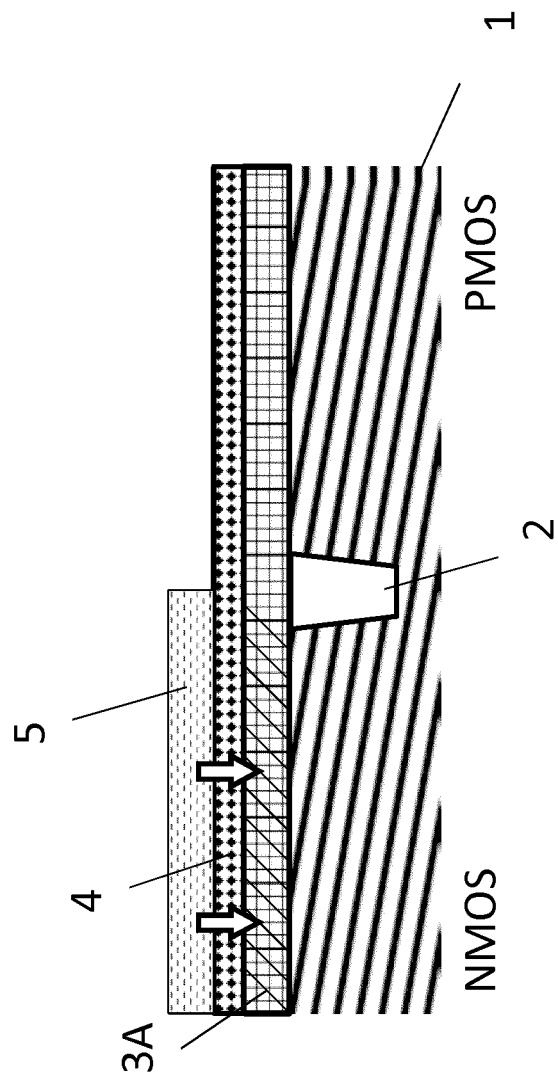

In FIG. 1(*b*) an etch stop layer 4 is provided on top of the high-k dielectric 3, according to an embodiment. In some embodiments, the etch stop layer 4 can serve to stop the wet etch of the metal layers of metal layer stacks (also called "metallic behaving layer") with the N or P type shifting element comprised in it.

In some embodiments, the etch stop layer 4 satisfies at least one of the following criteria:
  can be etched by reactive ion etching (RIE) for a gate etch;
  it is not etched by the wet etch chemistry used for the wet etch of the metallic behaving layer with the N or P type shifting element contained in it (e.g., $H_2O_2$, APM ($NH_4OH:H_2O_2:H_2O$ mixture, also called SC-1) or SPM ($H_2SO_4:H_2O_2$ mixture), HCl.);
  provides sufficient conductivity in the used thickness range (for instance resistivity*thickness$\leq 10^{-7}$ $\Omega cm_2$).

In some embodiments, the etch stop layer 4 can constitute a moderate diffusion barrier, preferably at the temperature used for the diffusion anneal step. The etch stop layer 4 can have a diffusion coefficient or diffusivity within the range of 1e-14 cm$^2$/s to 5e-21 cm$^2$/s, more preferably within the range of 1e-16 cm$^2$/s to 5e-20 cm$^2$/s, even more preferably within the range of 1e-17 cm$^2$/s to 5e-19 cm$^2$/s.

The etch stop layer 4 can comprise a single layer or comprise a multilayer (depicted as one layer in FIG. 1(*b*)). Where the etch stop layer 4 comprises a multilayer the bottom layer provides the metallic behaving interface with the high-k dielectric layer, and the top layer can act as etch stop layer (and could be less metallic-behaving in nature).

The thickness of both layers is not restricted but the combined thickness can be in the range of about 1 to 6 nm, more preferably in the range of 1 to 3 nm. For each layer the thickness is preferably in the range of 1 to 3 nm, more preferably within the range of 1 to 2 nm. In case a metal oxide is used as top layer its thickness is preferably smaller than the tunneling distance for electrons and holes (preferably smaller than 2 nm).

In embodiments where the etch stop layer 4 comprises a single layer, it can be advantageous if the etch stop layer 4 shows the metallic behavior and simultaneously serves as an etch stop layer.

In embodiments where the etch stop layer 4 comprises a bi-layer, the top layer of the etch stop layer 4 can for instance be made of or can comprise: more noble metals (like Ru, Pt and Ir), non etchable or less wet etchable metal nitrides that still behave metallic (e.g. TaN, HfN, NbN, MoN . . . ), non or less wet etchable Metal oxides that behave metallic (e.g. $RuO_x$, $MoO_x$<=2, . . . ), non or less wet etchable metal oxides that have a low band gap (e.g. $Ta_2O_3$, $TaO_x$, $Nb_2O_5$, $Sc_2O_3$, . . . ), or non or less wet etchable metal silicide (metallic) (e.g. $TiSi_x$, $TaSi_x$, $NiSi_x$, $CoSi_x$, $PtSi_x$, . . . ), among others.

In these embodiments, the bottom layer of the etch stop layer 4 satisfies the regular criteria of a metal gate, known to the skilled person. For example, the bottom layer of the etch stop layer 4 demonstrates the metallic behavior and the appropriate starting work function in absence of the shifting element. In these embodiments, the bottom layer can for instance be made of or comprise any suitable metal (e.g., W), metallic behaving metal nitride (e.g., TiN, TaN, HfN, NbN, MoN . . . ), metallic behaving oxide (e.g., $RuO_x$, $WO_x$, $MoO_x$<=2, . . . ) or Metal silicide (metallic) (e.g. $TiSi_x$, $TaSi_x$, $NiSi_x$, $CoSi_x$, $PtSi_x$, . . . ), among others.

In embodiments where the etch stop layer 4 comprises a single layer, the etch stop layer can for instance comprise or be made of any non wet etching metal (Pt, Ru, . . . ) or metallic behaving metal nitride (e.g. TaN, HfN, NbN, MoN . . . ), metallic behaving oxide (e.g. $RuO_x$, $MoO_x$<=2, . . . ) or metal silicide (metallic) (e.g. $TiSi_x$, $TaSi_x$, $NiSi_x$, $CoSi_x$, $PtSi_x$, . . . ), among others.

In embodiments where the etch stop layer 4 comprises a metal oxide, a material having a low band gap may be chosen to provide sufficient electron and hole conduction through the thin metal oxide (tunneling or hopping based conduction are considered both to be appropriate), despite the dielectric nature of the layer. In a certain view, it acts as a (semi) transparent layer for the electrons and the holes. As used herein, a low band gap for a dielectric corresponds to a bandgap smaller than 3 eV, or smaller than 2 eV, or smaller than 1 eV.

Examples of etch stop layers 4 according to some embodiments are given below:
  TaN (2-3 nm thick)
  a bilayer of TaN (2-3 nm thick)/TaO (2-3 nm thick)
  a bilayer of TiN (2-3 nm thick)/TaO (2-3 nm thick), where the TaO layer can for instance, but not only, be formed by air oxidation (e.g. 24 hours in ambient atmosphere) of a 2 nm deposited Ta layer.

This is based on the following reasoning and observations.

Many metals can be used above the etch stop layer as work function-shifting element. For example, TiN based metals can be advantageous in some aspects, because TiN can be selectively etched by APM ($H_2O_2$ and SPM).

In some embodiments, wet etch rate measurements in APM have shown the following etch rates:
  Etch rate (ER) TiN
    PVD TiN: 0.4 nm/s
    ALD TiN: 0.06 nm/s
  ER TaN (PVD TaN, with and without air break)
    0.067 nm/s
    Selectivity to PVD TIN: 0.4/0.067=5.9×
  ER Ta (PVD Ta no air break)
    0.026 nm/s
    Selectivity to PVD TIN: 0.4/0.026=15×
  ER Ta (PVD Ta with air break)
    0.005 nm/s
    Selectivity to PVD TIN: 0.4/0.005=80×
    Selectivity likely due to Ta2O3 formation (thickness unknown)

In FIG. 1(*c*), a first metal layer/stack 5 comprising an N-type shifting element is formed on the etch stop 4, according to an embodiment.

In some embodiments, the first metal layer/stack 5 comprising the N-type shifting element comprises, for instance, a TiN/Mg/TiN sandwich structure, a Mg/TiN bilayer structure where the etch stop layer 4 acts as bottom layer (i.e., etch stop layer/Mg/TiN), a La or $La_2O_3$ capping layer or a TiN/La/TiN sandwich structure, or any other suitable multi-layer stack that can provide a N-type work function by out-diffusion of dopant(s) through the etch stop layer 4 into the high-k dielectric layer.

In other embodiments, the first metal layer/stack 5 comprising the N-type shifting element comprises a matrix (a metal, a metal compound (e.g., nitride or oxide), or a dielectric (e.g., $SiO_2$)) containing an additive element (shifting element) that allows a shifting of the work function towards the conduction (N-type shifter) band edge by diffusing it into or through the high-k gate dielectric stack (being the combination of the interfacial oxide and or the high-k itself).

In some embodiments, the additive element for N-type shifting can comprise a rare earth element (a metal or rare earth metal oxide). In other embodiments, the additive element for N-type shifting comprises an alkaline earth element (metal or its oxide).

In embodiments where the additive element comprises an rare earth element, the N-type shifting element can comprise one or more of La, Gd, Tb, Er, Yb, Dy, Lu, Y, Yb, Sc.

In embodiments where the additive element comprises an alkaline earth element, the N-type shifting element can comprise one or more of Mg, Sr.

In FIG. 1(d) the first metal layer/stack 5 is patterned according to an embodiment. A part of the first metal layer/stack 5 is removed by wet processing on the second predetermined area. An organic (for instance resist with or without BARC) mask 6 based wet etch of the N-type material (or stack) is performed.

In embodiments where the first metal layer/stack 5 comprises a metal or a metal nitride, this wet etch can make use of $H_2O_2$, APM, SPM or another applicable wet chemistry.

In embodiments where the first metal layer/stack 5 comprises an oxide, this wet etch can make use of a HF based wet chemistry.

Optionally, part or the whole first metal layer/stack 5 can be removed by reactive ion etching (only full dry removal in case of selectivity to the etch stop layer).

FIG. 1(e) illustrates the N-shifting elements out-diffusing ("drive-in" anneal) from the first metal layer 5 though the etch stop layer 4 and into the high-k dielectric 3 in a first predetermined area, according to an embodiment.

In some embodiments, an additional drive-in anneal diffuses the N-type shifting element into or through the high-k dielectric 3 (which can comprise a combination of the interfacial oxide and the high-k layer, as discussed above).

The additional drive-in anneal can be optional and can advantageously be used when the subsequent drive-in anneal of P-type shifting elements is not sufficient on the N side, i.e. in the first predetermined area.

The same applies in the "PMOS-first" embodiments wherein the order of the provisioning steps for the N-shifting and P-shifting elements is switched.

Figure 1F:
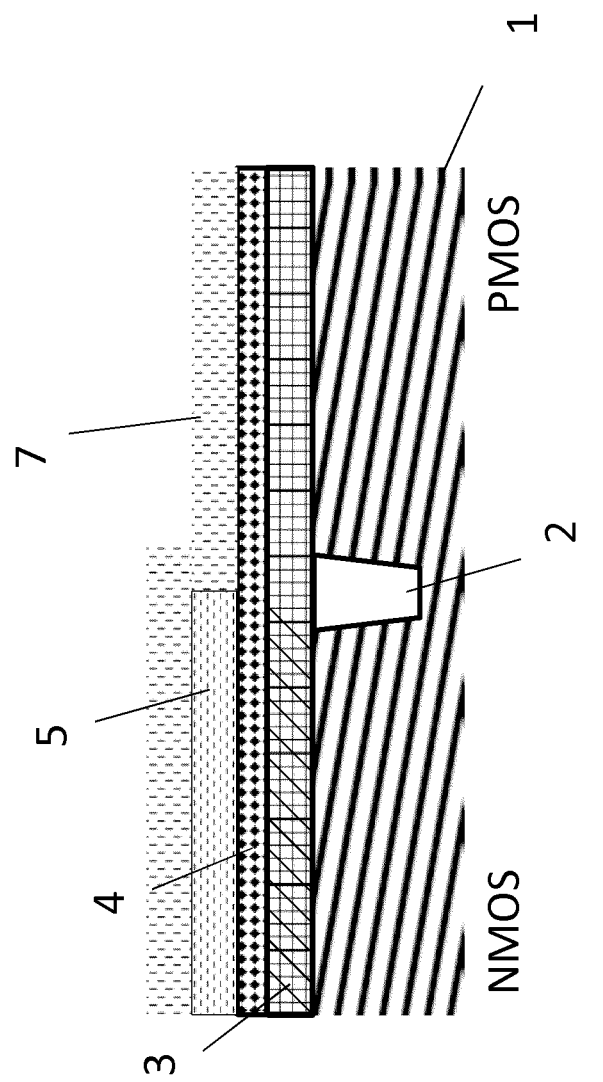

FIG. 1(f), the second metal layer/stack 7 is provided, comprising a P-type shifting element.

The second metal layer/stack 7 can comprise, any one of the following:
- a capping layer such as Al or $Al_2O_3$ of e.g. 2 nm thickness;
- a sandwich structure such as TiN/Al/TiN of e.g. 2 nm/2 nm/2 nm thickness;
- Al (or $Al_2O_3$)/TiN where the etch stop layer acts as bottom layer (etch stop layer/Al (or $Al_2O_3$)/TiN),
- any other multi-layer stack that can provide a P-type workfunction by out-diffusion of dopant(s) through the etch stop layer 4 into the high-k dielectric 3.

This second metal layer/stack 7 can comprise a matrix (metal, metal compound (nitride or oxide), dielectric ($SiO_2$)) containing an additive element that allows shifting the work function towards the silicon (or semiconductor substrate) valence (P-type shifter) band edge by diffusing into or through the high-k dielectric 3 (which can comprise a combination of the interfacial oxide and the high-k dielectric, as discussed above).

The P-type shifting element can for instance be or comprise Al (for instance in the form of elemental Al or $Al_2O_3$).

FIG. 1(g) illustrates the P-type shifting element out-diffusion anneal step ("drive-in anneal"). An anneal is performed to diffuse the N-type shifting element and the P-type shifting element through the etch stop layer 4 and into or through the high-k dielectric 3A over the NMOS active region and the high-k dielectric 4B over the PMOS active region, respectively. Similar to FIG. 1(e), the high-k dielectric 3A and 3B can comprise a combination of the interfacial oxide and or the high-k itself. The anneal step can diffuse both the N and P-type shifting elements.

According to some embodiments, either the PMOS or NMOS side is processed first, in view of which sequence gives the best flexibility for controlling the dopant diffusion into the gate stack.

Figure 1H:
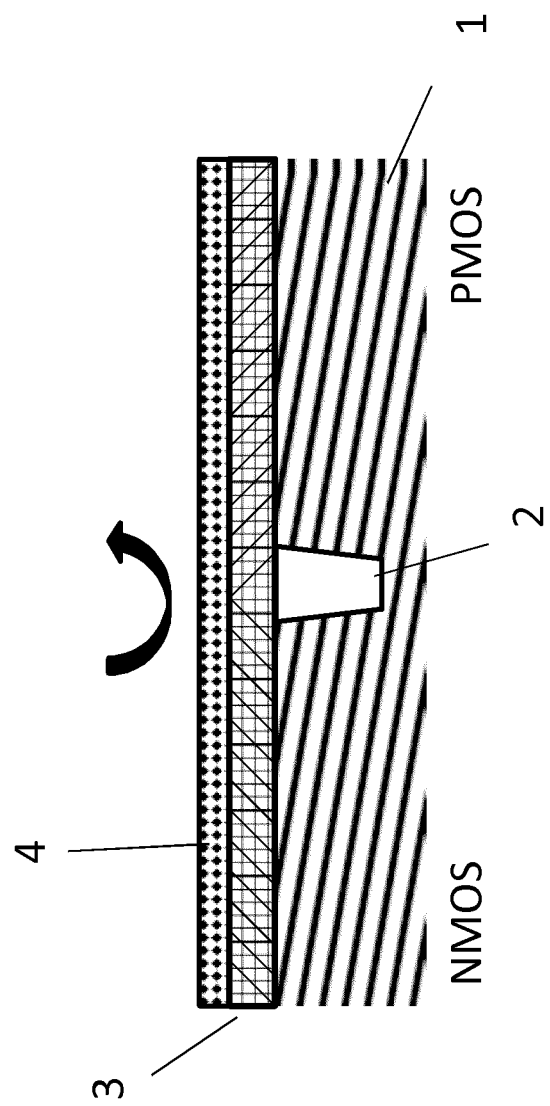

FIG. 1(h) illustrates the removal of the first and second metal layers or first and second metal layer stacks. A wet removal of the first and/or second metal layer/stacks 5,7, selective to the etch stop layer 4 is performed.

In embodiments where the N- and P-type material (or stack) is a metal or a metal nitride this wet etch can for instance make use of $H_2O_2$, APM, SPM or another applicable wet chemistry.

In embodiments where the N-type material (or stack) is an oxide, this wet etch can for instance make use of HF based wet chemistry.

Optionally, part or the whole N and P-type material (or stack) etch can be removed by RIE (only full dry removal in case of selectivity to the etch stop layer).

Figure 1I:
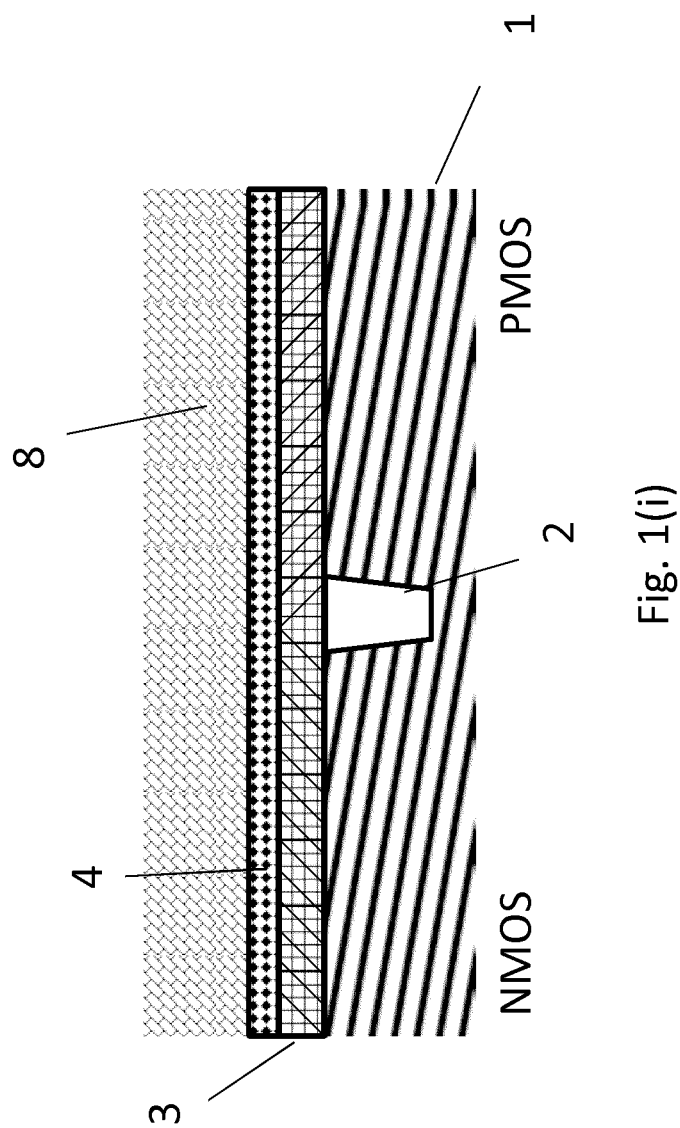

FIG. 1(i) illustrates the deposition of a gate capping layer 8. The gate capping layer 8 for instance can be or comprise TiN (or any other metal or metallic behaving compound) and can further comprise for instance silicon. The capping layer can for instance comprise a first sublayer of TiN and a second sublayer of silicon.

Figure 1J:
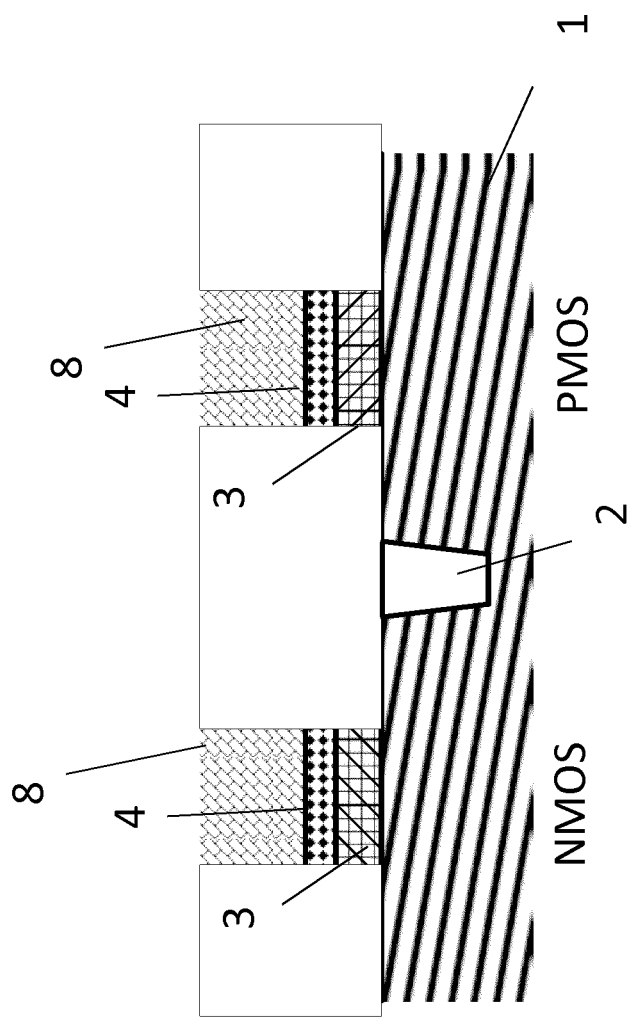

FIG. 1(j) illustrates the gate patterning process.

The etch can be performed on NMOS and PMOS sides, whereby both sides have about the same gate height and materials, providing a symmetric gate technology on NMOS and PMOS. The formation of a foot due to a different or thicker metal on the N or P-side can thus be avoided. Such a foot (triangular-shaped edge of gate in its lower portion (regions 3+4) can disadvantageously be formed when a non-homogeneous material stack is etched. This is a problem especially when different stack heights for NMOS and PMOS device are present.

It will be appreciated by the skilled person that according to embodiments of the present disclosure, the high-k dielectric layer or stack is protected from wet cleaning or plasma processing, up until the gate etch step.

Figure 1K:
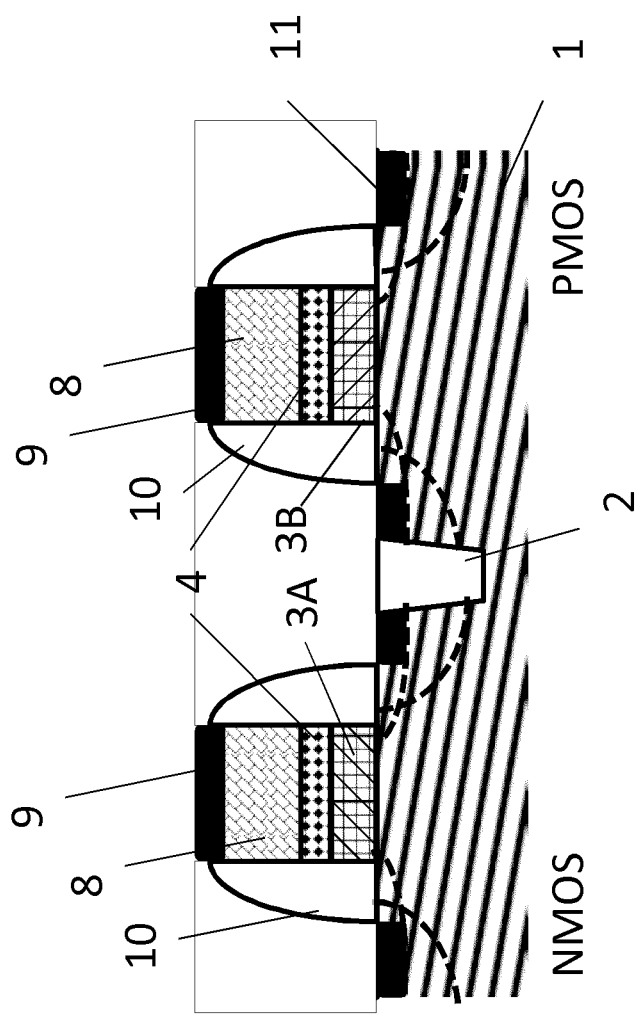

FIG. 1(k) illustrates the final phase of the front end of line (FEOL) processing, whereby a MOSFET device is manufactured. Extension implants are provided (illustrated as dashed lines). Spacers 10 are formed. Source/Drain implants are performed (dashed lines). A silicidation process is performed in regions 9 and 11, preferably by using a classical metal (e.g. Ni, Co, NiPt) in order to ensure N to P connectivity, low resistivity and good contact resistance.

Figure 2C:
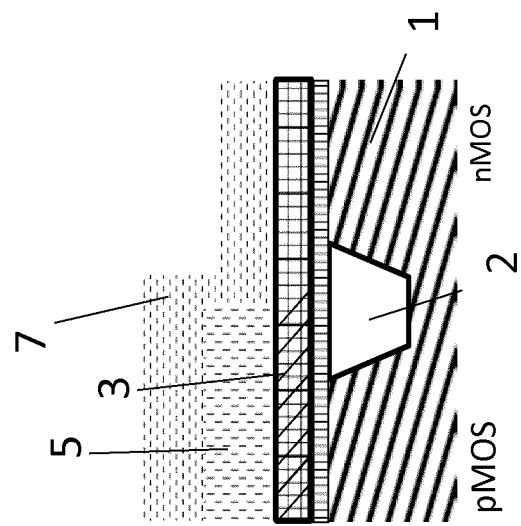
FIGS. 2(a) to (h) illustrate a process flow according to a second embodiment of the present disclosure.
Figure 2B:
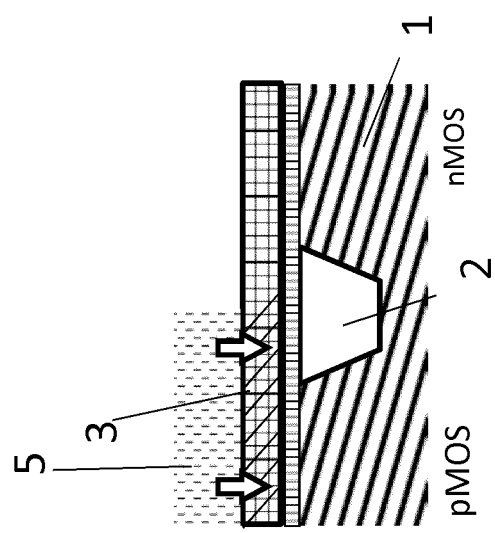
Figure 2A:
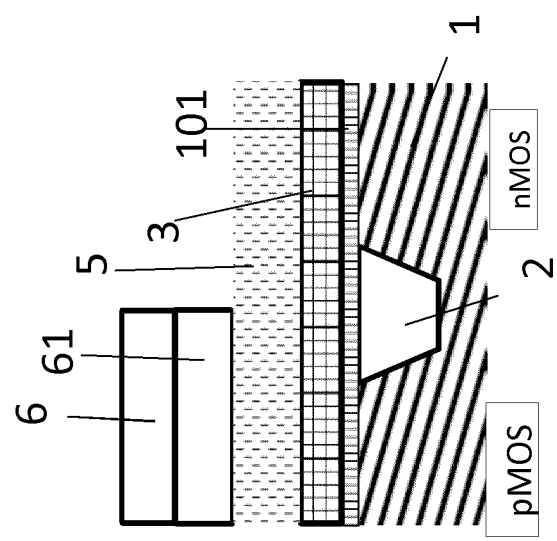
Figure 2F:
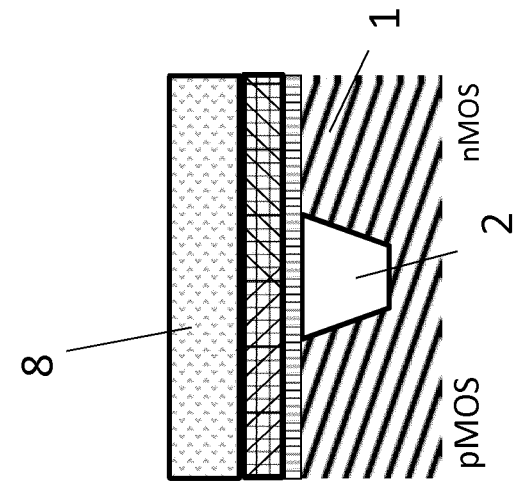
Figure 2E:
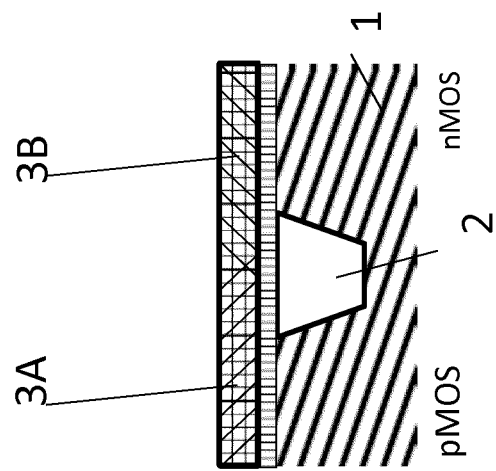
Figure 2D:
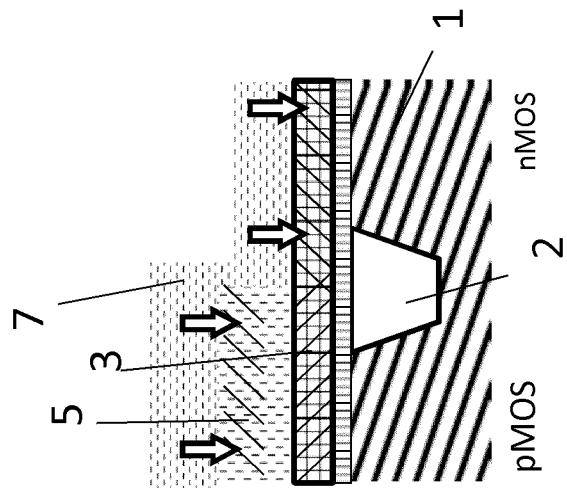
Figure 2:
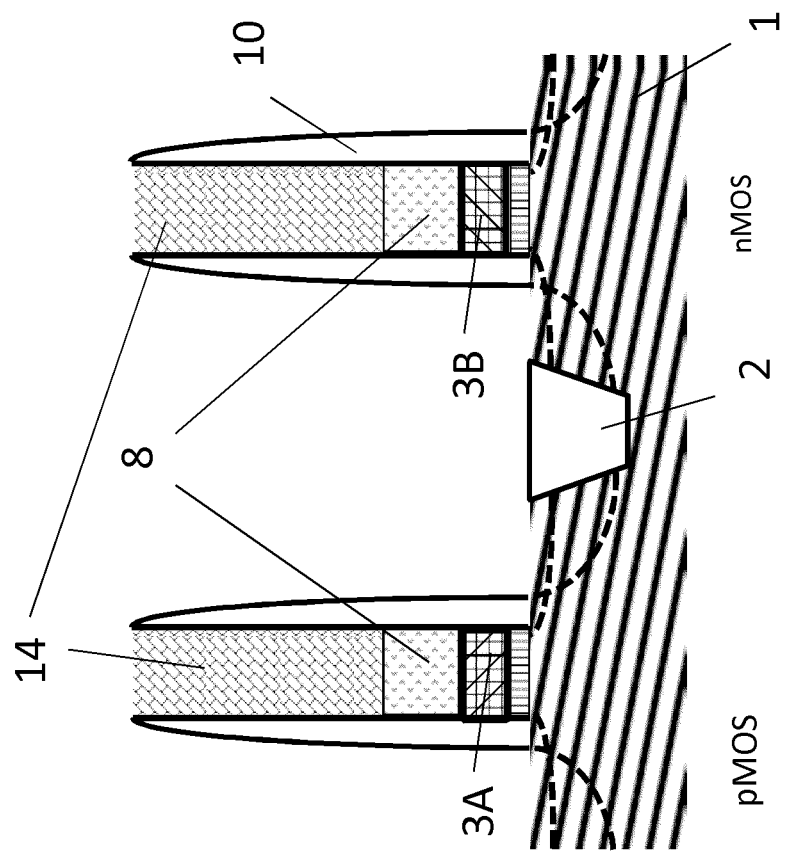
Figure 2:
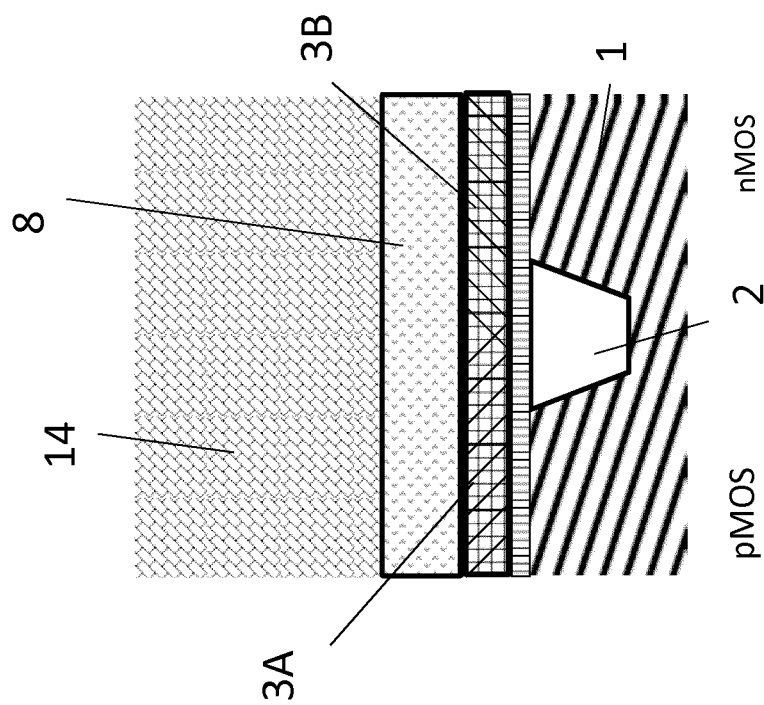

In FIGS. 2 (a) to (h) a process flow according to another example embodiment of the present invention is depicted, wherein no use is made of the etch stop layer. The process steps and device characteristics are further generally similar to those described in accordance with FIG. 1, but some constraints associated to the etch stop layer are not anymore an issue. This can result is some other material systems which can be used. It is expected that it is also easier to tune the work function according to this flow.

Note that the interfacial oxide layer (101) (also present in FIG. 1) is explicitly shown in this flow. In this flow, high-k is though exposed to wet chemistry (e.g. in steps 2.b. and 2.e.), with associated yield and reliability issues.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of manufacturing a dual work function semiconductor device, the method comprising:
   providing a substrate comprising a first predetermined area for forming a transistor of a first conduction type and a second predetermined area for forming a transistor of a second conduction type, the first conduction type being different from the second conduction type;
   forming a dielectric layer on the substrate, the dielectric layer extending to cover at least a part of the first area and extending to cover at least a part of the second area;
   forming a first metal layer/stack on the dielectric layer in the first predetermined area, wherein the first metal layer/stack comprises a first work function-shifting element,
   wherein the first metal layer/stack is one of TiN/Mg/TiN, Mg/TiN, TiN/La/TiN, La, La$_2$O$_3$ or a layer comprising a matrix material containing the first work function-shifting element different from elements of the matrix material;
   forming a second metal layer/stack directly on the first metal layer/stack in the first predetermined area and on the dielectric layer in the second predetermined area, wherein the second metal layer/stack comprises a second work function-shifting element;
   annealing to diffuse the first work function-shifting element and the second work function-shifting element into the dielectric layer;
   removing the first metal layer/stack and the second metal layer/stack; and
   forming a third metal layer/stack in the first predetermined area and the second predetermined area.

2. The method of claim 1, wherein the first metal layer/stack is formed of a matrix material that is formed of a metal, a metal compound or a dielectric that contains the first work function-shifting element.

3. The method of claim 2, wherein the work function-shifting element is a rare earth metal selected from the group consisting of La, Gd, Tb, Er, Yb, Dy, Lu, Y, and Sc.

4. The method of claim 2, wherein the matrix material is an oxide or a nitride.

5. The method of claim 2, wherein the work function-shifting element is an alkaline earth metal.

6. The method of claim 5, wherein the work function-shifting element is Mg or Sr.

7. A method of manufacturing a dual work function semiconductor device, the method comprising:
   providing a substrate comprising a first predetermined area for forming a transistor of a first conduction type and a second predetermined area for forming a transistor of a second conduction type, the first conduction type being different from the second conduction type;
   forming a dielectric layer on the substrate, the dielectric layer extending to cover at least a part of the first area and extending to cover at least a part of the second area;
   providing an etch stop layer on the dielectric layer,
   wherein the etch stop layer is substantially etch-resistant to an etchant adapted for etching the first metal layer/stack and/or the second metal layer/stack, and
   wherein the etch stop layer is adapted for allowing diffusion of the first work function-shifting element and the second work function-shifting element there through;
   forming a first metal layer/stack on the etch stop layer in the first predetermined area, wherein the first metal layer/stack comprises a first work function-shifting element;
   forming a second metal layer/stack on the first metal layer/stack in the first predetermined area and on the etch stop layer in the second predetermined area, wherein the second metal layer/stack comprises a second work function-shifting element;
   annealing to diffuse the first work function-shifting element and the second work function-shifting element into the dielectric layer;
   removing the first metal layer/stack and the second metal layer/stack; and
   forming a third metal layer/stack in the first predetermined area and the second predetermined area.

8. The method of claim 7, comprising an independent anneal process for diffusion of the first work function-shifting elements into the dielectric layer, before depositing the second metal layer/stack comprising the second work function-shifting element.

9. The method of claim 7, wherein annealing does not provide diffusion of the second work function-shifting element into the dielectric layer in the first predetermined area.

10. The method of claim 7, wherein the etch stop layer comprises at least one of TaN, Ta, TaO Ta$_2$O$_3$ and TiN.

11. The method of claim 10, wherein the etch stop layer comprises a bi-layer including a TaN layer and one of a TaO layer and a Ta$_2$O$_3$ layer.

12. The method of claim 10, wherein the etch stop layer comprises a bi-layer including a TiN layer and one of a TaO layer and Ta$_2$O$_3$ layer.

13. The method of claim 7, wherein the first metal layer/stack, or the second metal layer/stack comprises one of TiN/Mg/TiN, Mg/TiN, La, La$_2$O$_3$, and TiN/La/TiN.

14. The method of claim 7, wherein at least one of the first metal layer/stack and the second metal layer/stack comprises aluminum.

15. The method of claim 14, wherein at least one of the first metal layer/stack and the second metal layer/stack comprises aluminum oxide covered with a layer of TiN, or covered with a trilayer comprising TiN/Al/TiN.

16. The method of claim 14, wherein at least one of the first metal layer/stack and the second metal layer/stack comprises aluminum oxide covered with a trilayer comprising TiN/Al/TiN.

17. The method of claim 7, wherein the etch stop layer has a thickness between about 0.5 nm and 20 nm.

18. The method of claim 7,
   wherein providing the substrate comprises providing an isolation area electrically isolating the first predetermined area from the second predetermined area, and
   wherein the method further comprises removing a portion of the dielectric layer, the etch stop layer, and the third metal layer/stack at a location above the isolation region.

19. The method of claim 7, wherein the dielectric layer comprises a high-k dielectric.

20. The method of claim 19, wherein the high-k dielectric comprises one of $HfO_2$, HfSiO, HfSiN, $ZrO_2$, and a doped hafnium oxide.

* * * * *